(12) United States Patent
Mima

(10) Patent No.: US 8,890,394 B2
(45) Date of Patent: Nov. 18, 2014

(54) LIGHT-EMITTING DEVICE AND MANUFACTURING METHOD THEREOF

(75) Inventor: Shoji Mima, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 13/574,834

(22) PCT Filed: Jan. 12, 2011

(86) PCT No.: PCT/JP2011/050310
§ 371 (c)(1),
(2), (4) Date: Jul. 24, 2012

(87) PCT Pub. No.: WO2011/093125
PCT Pub. Date: Aug. 4, 2011

(65) Prior Publication Data
US 2012/0293058 A1  Nov. 22, 2012

(30) Foreign Application Priority Data
Jan. 26, 2010 (JP) ................................. 2010-013976

(51) Int. Cl.
*H01J 1/62* (2006.01)
*H01J 63/04* (2006.01)
*H01J 1/02* (2006.01)

(52) U.S. Cl.
USPC ............. 313/46; 313/483; 313/500; 313/501; 313/502; 313/503; 313/504; 313/505; 313/506; 313/510; 313/512; 313/11

(58) Field of Classification Search
None
See application file for complete search history.

(56) References Cited

U.S. PATENT DOCUMENTS

| 7,063,902 B2 * | 6/2006 | Kikuchi et al. | 428/690 |
| 7,393,258 B2 * | 7/2008 | Kim et al. | 445/25 |
| 7,838,879 B2 * | 11/2010 | Park | 257/59 |

(Continued)

FOREIGN PATENT DOCUMENTS

| CN | 101093852 A | 12/2007 |
| JP | 2003-022891 A | 1/2003 |

(Continued)

OTHER PUBLICATIONS

International Search Report, PCT/JP2011/050310, dated Apr. 12, 2011.

(Continued)

*Primary Examiner* — Natalie Walford
(74) *Attorney, Agent, or Firm* — Sughrue Mion, PLLC

(57) ABSTRACT

It is an object of the present invention to provide a light-emitting device having a composition capable of reducing a film thickness of a heat conducting member. The present invention provides a light-emitting device including: a supporting substrate; an organic electroluminescent element disposed on the supporting substrate; a sealing substrate for sealing the organic electroluminescent element, having a convex portion protruding toward the organic electroluminescent element; and a heat conducting member that is provided between the organic electroluminescent element and the convex portion, in which the organic electroluminescent element and the convex portion are attached through the heat conducting member, and in which a part or whole of the convex portion is overlapped with the organic electroluminescent element, and an area of an overlapped region of the convex portion and the organic electroluminescent element is smaller than an area of the organic electroluminescent element, as viewed from a thickness direction of the supporting substrate.

10 Claims, 3 Drawing Sheets

(56) References Cited

U.S. PATENT DOCUMENTS

| | | | |
|---|---|---|---|
| 7,843,136 B2* | 11/2010 | Ishii et al. | 313/512 |
| 2004/0191566 A1 | 9/2004 | Kikuchi et al. | |
| 2007/0029609 A1 | 2/2007 | Park | |
| 2007/0290609 A1 | 12/2007 | Ishii et al. | |
| 2011/0050082 A1* | 3/2011 | Inoue et al. | 313/483 |

FOREIGN PATENT DOCUMENTS

| | | |
|---|---|---|
| JP | 2004-265776 A | 9/2004 |
| JP | 2007-188704 A | 7/2007 |
| JP | 2007-335365 A | 12/2007 |
| JP | 2008-181832 A | 8/2008 |
| JP | 2008-243650 A | 10/2008 |
| JP | 2009-129723 A | 6/2009 |
| JP | 2009134897 A | 6/2009 |
| JP | 2011-029162 A | 2/2011 |
| JP | 2011-040383 A | 2/2011 |
| WO | 2006/022273 A2 | 3/2006 |
| WO | 2009/131019 A1 | 10/2009 |

OTHER PUBLICATIONS

Notice of Rejection Dated Oct. 8, 2013, issued in Japanese Patent Application No. 2010-013976.
State Intellectual Property Office of People's Republic of China, "First Office Action," issued in connection with Chinese Patent Application No. 201180007183.4, dated Aug. 15, 2014.

* cited by examiner

LIGHT-EMITTING DEVICE AND MANUFACTURING METHOD THEREOF

CROSS REFERENCE TO RELATED APPLICATIONS

This application is a National Stage of International Application No. PCT/JP2011/050310 filed Jan. 12, 2011, claiming priority based on Japan Patent Application No. 2010-013976 filed Jan. 26, 2010, the contents of all of which are incorporated herein by reference in their entirety.

TECHNICAL FIELD

The present invention relates to a light-emitting device and a manufacturing method thereof.

BACKGROUND ART

The organic electroluminescent element (hereinafter, also referred to as an "organic EL element") is a type of the light-emitting element that emits light by applying a voltage. At present, light-emitting devices such as an illuminator and a display device which use the organic EL element as a light source are being put to practical use and brought to the marketplace.

An organic EL element generates heat during use, and the temperature thereof increases. Because bringing an organic EL element into a high temperature during use leads to accelerating degradation of the element, various properties of the element are degraded. For example, a luminance half-life period of the element becomes shorter. Therefore, in order to lower a temperature during use, various measures for heat dissipation are being studied.

An organic EL element is usually provided on a supporting substrate, and further a sealing substrate or a sealing film for covering the organic EL element is provided on the supporting substrate. Between the organic EL element and the sealing substrate, a predetermined gap is provided. When the gap is filled with a predetermined gas or is in vacuum, because heat conduction from the organic EL element to the sealing substrate is poor, there is a problem that heat generated in the organic EL element cannot be efficiently dissipated from the sealing substrate. In order to improve heat conduction from the organic EL element to the sealing substrate, a device was proposed in which a heat conducting member having better thermal conductivity than a predetermined gas is provided between the sealing substrate and the organic EL element (for example, see Document 1).

RELATED ART DOCUMENTS

Patent Document 1: JP 2009-129723 A

DISCLOSURE OF INVENTION

Problem to be Solved by the Invention

The above-described light-emitting device provided with a heat conducting member is produced, for example as follows: firstly, forming an organic EL element on a supporting substrate; next, applying a thermoset resin that becomes a heat conducting member to a sealing substrate; then, contacting this sealing substrate and the supporting substrate with pressure so as to interpose the organic EL element; and performing heat-curing to the thermoset resin, and thereby the light-emitting device is produced. The thinner the heat conducting member is, the more efficiently the heat conducting member conducts heat, and therefore a thickness thereof is preferable to be thin from the viewpoint of heat dissipation. Accordingly, when contacting the sealing substrate and the supporting substrate with pressure, it is preferable that by providing a predetermined pressure the heat conducting member is formed so as to become thin. However, the heat conducting member could not become thin by simply providing a predetermined pressure and as the result it was difficult to obtain a desired thin heat-conducting member in some cases. Particularly, when a material for the heat conducting member has a high viscosity, it is difficult to form a heat conducting member having a thin film thickness.

Therefore, it is an object of the present invention to provide a light-emitting device having a composition capable of reducing the film thickness of a heat conducting member and having a high heat dissipation characteristic.

The present invention provides a light-emitting device and a manufacturing method thereof as described below.

[1] A light-emitting device comprising:
 a supporting substrate;
 an organic EL element disposed on the supporting substrate;
 a sealing substrate for sealing the organic EL element, comprising a convex portion protruding toward the organic EL element; and
 a heat conducting member that is provided between the organic EL element and the convex portion,
 wherein the organic EL element and the convex portion are attached through the heat conducting member,
 wherein a part or whole of the convex portion is overlapped with the organic EL element, and an area of an overlapped region of the convex portion and the organic EL element is smaller than an area of the organic EL element, as viewed from a thickness direction of the supporting substrate.

[2] The light-emitting device according to [1], wherein the sealing substrate comprises a plurality of convex portions, and two or more of the convex portions are configured to be overlapped with one organic EL element, as viewed from a thickness direction of the supporting substrate.

[3] The light-emitting device according to [1] or [2], wherein a plurality of the organic EL elements are provided on the supporting substrate.

[4] The light-emitting device according to any one of [1] to [3], wherein the sealing substrate comprises a concave portion that is formed on a side opposite to the side facing the supporting substrate and is configured to be along a shape of the convex portion.

[5] The light-emitting device according to any one of [1] to [4], wherein the sealing substrate is formed of a metal.

[6] The light-emitting device according to any one of [1] to [5], wherein the heat conducting member includes a filler, and the filer has the highest heat conductivity among materials included in the heat conducting member.

[7] The light-emitting device according to [1], wherein the heat conducting member includes a filler that is formed of at least one material selected from the group consisting of aluminum oxide, aluminum nitride, beryllium oxide, and boron nitride.

[8] The light-emitting device according to [6], wherein the heat conducting member includes a filler that is formed of at least one material selected from the group consisting of aluminum, copper, silver and any alloys thereof.

[9] The light-emitting device according to [6], wherein the heat conducting member includes a filler that is formed of at least one material selected from the group consisting of sintered materials comprising carbon or silicon.

[10] A method for manufacturing a light-emitting device according to any one [1] to [9], comprising:

forming the organic EL element on the supporting substrate;

supplying the heat conducting member to either the organic EL element or the sealing substrate, or both; and contacting with pressure the supporting substrate and the convex portion of the sealing substrate, such that a part or whole of the convex portion is overlapped with the organic EL element as viewed from a thickness direction of the supporting substrate.

Effect of Invention

According to the present invention, because a sealing substrate comprises a convex portion protruding toward an organic EL element and an area of an overlapped region of the convex portion and the organic EL element is smaller than an area of the organic EL element, when contacting the sealing substrate to a supporting substrate with pressure under a predetermined force, a stress (that is, pressure) per unit area applied on the surface of the convex portion becomes high. Therefore, a heat conducting member having a thin film thickness can be obtained. As the result, a light-emitting device having a high heat dissipation characteristic can be obtained.

DESCRIPTION OF EMBODIMENTS

A light-emitting device of the present invention is a light-emitting device in which a supporting substrate, an organic EL element provided on the supporting substrate, a heat conducting member provided on the organic EL element, and a sealing substrate for sealing the organic EL element are disposed in this order, wherein: the sealing substrate comprises a convex portion protruding toward the organic EL element; the convex portion and the organic EL element are attached to interpose the heat conducting member; a part or whole of the convex portion is configured so as to be overlapped with the organic EL element as viewed from a thickness direction of the supporting substrate; and an area of an overlapped region of the convex portion and the organic EL element is smaller than an area of the organic EL element.

<Composition of Light-Emitting Device>

Figure 1:
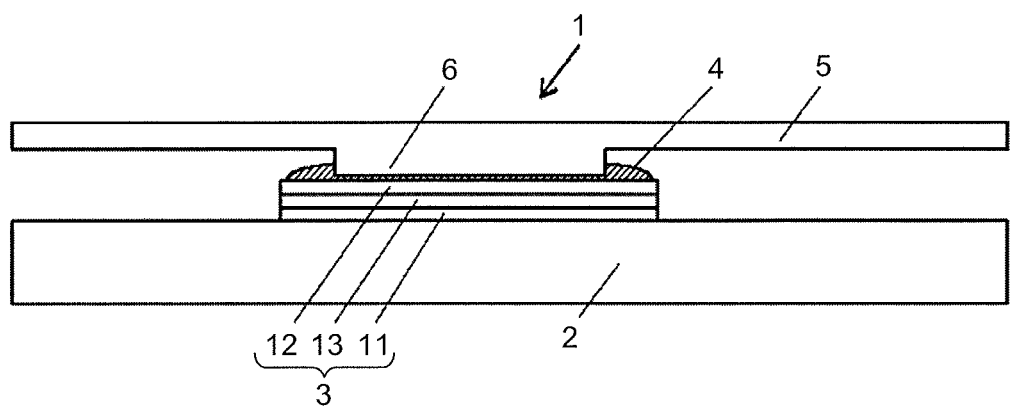
FIG. 1 is a schematic view from the side, illustrating a light-emitting device 1 according to one embodiment of the present invention.

First, a composition of a light-emitting device is described. FIG. 1 is a schematic view illustrating a light-emitting device 1 of one embodiment of the present invention. A light-emitting device of the present invention may include one organic EL element or a plurality of organic EL elements, and firstly a composition of a light-emitting device including one organic EL element is described regarding the embodiment illustrated in FIG. 1. Next, as another embodiment, a light-emitting device including a plurality of organic EL elements is described.

In the embodiment illustrated in FIG. 1, a light-emitting device 1 has a composition in which a supporting substrate 2, an organic EL element 3 provided on the supporting substrate 2, a heat conducting member 4 provided on the organic EL element 3, and a sealing substrate 5 for sealing the organic EL element 3 are disposed in this order.

Although it is not shown in the figure, between the supporting substrate 2 and the sealing substrate 5, an adhering member for adhering these substrates is usually provided further. Usually, the adhering member is provided continuously so as to enclose the organic EL element as viewed from a thickness direction of the supporting substrate. In the case of the embodiment illustrated in FIG. 1, an adhering member may be provided, for example, on the periphery of the supporting substrate 2 and the sealing substrate 5 so as to enclose the circumference of the organic EL element 3. Hereinafter, although in other embodiments the adhering member is not also shown in the figures, in the same manner, the adhering member may be provided so as to enclose the organic EL element. In the case of an embodiment in which a plurality of organic EL elements are provided on the supporting substrate, an adhering member may be provided on the periphery of the supporting substrate 2 and the sealing substrate 5 so as to enclose a plurality of organic EL elements all together.

In FIGS. 1 to 6, the part representing the heat conducting member 4 is hatched.

In the embodiment illustrated in FIG. 1, the supporting substrate 2 is a substrate on which the organic EL element 3 is formed. As the supporting substrate 2, a substrate in which a circuit for driving the organic EL element 3 is formed in advance, may be used. As the supporting substrate 2, a substrate having optical transparency may be used if necessary. For example, when a so-called bottom emission-type organic EL element 3 that emits light toward the supporting substrate 2 is provided on the supporting substrate 2, a substrate having optical transparency is used as the supporting substrate 2. When a so-called top emission-type organic EL element 3 that emits light toward the sealing substrate 5 is provided on a supporting substrate, a non-transparent substrate may be used as the supporting substrate 2. As the supporting substrate, for example, a glass plate, a plastic plate, a polymer film, a metal plate, a silicon plate, or a layered body of these materials may be used.

As illustrated in FIG. 1, the organic EL element 3 is provided on the supporting substrate 2. The organic EL element 3 is composed of a pair of electrodes 11 and 12 and a light-emitting layer 13 provided between the electrodes. Although FIG. 1 illustrates that the organic EL element 3 is composed of the pair of electrodes 11 and 12 and the light-emitting layer 13, a certain layer(s) may be provided between the pair of electrodes 11 and 12 if necessary besides the light-emitting layer 13.

In the present specification, as viewed from a thickness direction of the supporting substrate, a part working as an organic EL element, that is, a part that emits light when applying a voltage is defined as an organic EL element.

FIG. 1 is a schematic view from the side, illustrating the organic EL element 3. In FIG. 1, viewing an object from a thickness direction of the supporting substrate 2 means viewing an object in a planar view from the upper side or the lower side in FIG. 1.

An organic EL element emits light in a region that comprises all the components included in the organic EL element. In the region lacking a part of the components, for example, a region lacking any one electrode among the pair of electrodes does not emit light. For example, when a part of a light-emitting layer or an electrode extends and protrudes from the part working as an organic EL element and the extending part does not emit light, the extending part is a part that does not function as an organic EL element. Therefore, even if the extending part comprises the same material as a material for a light-emitting layer or an electrode, it does not configure a part of an organic EL element. Specifically, when a plurality of organic EL elements are provided on a supporting substrate, an electrode or a light-emitting layer may be formed as ranging over the organic EL elements. In such a case, because the region between the organic EL elements does not emit light, the light-emitting layer or the electrode formed between the organic EL elements does not configure an organic EL element. Even when one organic EL element is provided, a light-emitting layer, for example, may be formed so as to extend from a pair of electrodes. In such a case, because the extending part does not emit light, the light-emitting layer extending and protruding from the pair of electrodes does not configure a part of an organic EL element.

A size of the organic EL element 3 may be set according to the specification of a device for which the organic EL element is employed. The size of the organic EL element 3 is, when it is used as a pixel of a display device, for example, approximately 1 $\mu m^2$ to $10^{-6}$ $m^2$; when it is used as a backlight for a liquid crystal display device or the like, for example, approximately $10^{-5}$ $m^2$ to 3.5 $m^2$; and when it is used as a light source for an illuminator, for example, approximately $10^{-5}$ $m^2$ to 3.0 $m^2$.

As described below, because a light-emitting device of the present invention improves a heat dissipation characteristic, this may be preferably used for a light-emitting device provided with a large-sized organic EL element having high calorific value. That is, a light-emitting device of the present invention may be preferably used for light-emitting devices requiring an organic EL element having a large size and high calorific value, such as a backlight and an illuminator.

In a light-emitting device of the present invention, as viewed from a thickness direction of a supporting substrate, a convex portion of the sealing substrate is configured such that a part or whole of the convex portion is overlapped with the organic EL element. The number of convex portions on the supporting substrate may be the same as the number of organic EL elements or may be larger than the number of organic EL elements. In FIG. 1 an embodiment is illustrated, in which a sealing substrate 5 provided with one convex portion 6 and one organic EL element 3 are attached. In the embodiment illustrated in FIG. 1, as viewed from a thickness direction of the supporting substrate 2, whole surface of the convex portion 6 of the sealing substrate 5 that faces the organic EL element 3 is disposed so as to overlap with the organic EL element 3.

As the sealing substrate 5, for example, a plate included in the examples applicable to the supporting substrate 2 may be used as appropriate, and a member having a high thermal conductivity may be preferably used. For example, a metal plate having a high thermal conductivity is preferably used, and in particular a plate composed of copper, aluminum, silver, tungsten, iron, nickel, chromium, or an alloy thereof (such as a stainless steel) is preferably used.

It is preferable that a thickness of the sealing substrate 5 is thinner, because heat dissipation becomes higher, and the thickness is for example approximately 0.1 mm to 10 mm, and preferably 0.5 mm to 5 mm. Here, a thickness of the sealing substrate means the thickness of a part of a sealing substrate excluding the convex portion 6. A height of the convex portion 6 is, for example approximately 0.01 mm to 10 mm, and preferably 0.05 mm to 5 mm.

The convex portion 6 of the sealing substrate 5 may have the same appearance as or a different appearance from that of the organic EL element 3, as viewed from a thickness direction of the sealing substrate 5. For example, when the organic EL element 3 has a rectangular shape as viewed from a thickness direction of the sealing substrate 5, the convex portion 6 may also have a rectangular shape and the convex portion 6 may be formed such that an area thereof becomes smaller. Regarding the sealing substrate 5 in the embodiment illustrated in FIG. 1, the convex portion 6 is provided which is smaller than the organic EL element 3 as viewed from a thickness direction of the supporting substrate 2; however, as described below, as another embodiment a convex portion may be designed which is larger than the organic EL element or which has a larger width than the organic EL element has. The convex portion may be formed, for example, into one or a plurality of strip(s)-shaped. Furthermore, not only into a strip shape, but also for example into a lattice shape, an oblique lattice shape, or a matrix shape, the convex portion may be formed.

The heat conducting member 4 is provided between the convex portion 6 and the organic EL element 3. The heat conducting member 4 is provided so as to contact with both the convex portion 6 and the organic EL element 3.

The heat conducting member 4 is preferably composed of a material having a high thermal conductivity and may composed of one or a plurality of types of material(s).

As the Example of a material for forming the heat conducting member 4, resins such as an epoxy resin, an acrylic resin, a nylon resin, a urethane resin, a phenolic resin, a silicon resin, and an imide resin are included.

The heat conducting member 4 may include a filler. The filler included in the heat conducting member 4 has preferably the highest thermal conductivity among the materials included in the heat conducting member 4. It is preferable that the filler is dispersed in a base material included in the heat conducting member 4 and is disposed. For example, when the heat conducting member 4 is composed of an above-described resin and a filler disposed in this resin, it is preferable that a filler having a higher thermal conductivity than that of the resin is disposed so as to be dispersed in the resin. The filler is preferably is disposed so as to be dispersed homogeneously in the resin. Thus, by dispersing a filler having a high thermal conductivity, moldability of the heat conducting member 4 can be maintained and the thermal conductivity of the heat conducting member 4 can be enhanced.

When a weight ratio of the filler in the heat conducting member 4 becomes high, the thermal conductivity of the heat conducting member 4 is improved; however, because a viscosity of the material for the heat conducting member 4 becomes high and moldability thereof becomes deteriorated, it becomes difficult to make a film thickness of the heat conducting member 4 thin. Then, in view of thermal conductivity and moldability, a weight ratio of a filler in the heat conducting member 4 is, for example 10% by volume to 80% by volume, preferably 20% by volume to 60% by volume.

As a preferred embodiment of the heat conducting member 4, the heat conducting member 4 may include a filler formed of at least one type of material among aluminum oxide, aluminum nitride, beryllium oxide, and boron nitride.

It may be preferable that a heat conducting member has a member having electric insulation property. This is because, for example, when a plurality of organic EL elements are provided on a supporting substrate and a sealing substrate having conductivity such as a metal plate is used, and if the heat conducting member exhibits conductivity, electric conduction may possibly occur between the organic EL elements through the heat conducting member and the sealing substrate. A plurality of types of a filler composed of aluminum oxide, aluminum nitride, beryllium oxide, or boron nitride have low conductivity; therefore, a heat conducting member exhibiting electric insulation property and good thermal conductivity can be achieved by using those fillers. As such a filler, a commercially available product may be used. For example, as a filler composed of aluminum oxide, SHO-FILLER (registered trade mark)/FA (manufactured by Showa Denko K.K.) may be used. Because a plurality of types of a filler composed of aluminum, copper, silver, or an alloy of two or more types of these metals have high conductivity, when a heat conducting member exhibiting electric insulation property is necessary to be provided, it is preferable to set a content of the filler in the heat conducting member low as appropriate.

As a preferred embodiment of the heat conducting member 4, the heat conducting member 4 may include a filler formed of at least one type of material selected from aluminum, copper, silver, and an alloy of two or more types of these metals. As such a filler, a commercially available product may be used. For example, as a filler composed of aluminum, aluminum powder for filler (manufactured by Toyo Aluminum K.K.) may be used.

As a preferred embodiment of the heat conducting member 4, the heat conducting member 4 may include at least one type of a filler among sintered materials including carbon or silicon. The sintered material may solely comprise carbon or silicon. As such a filler, a commercially available product may be used. As the filler of a sintered material, for example, silicon carbide powder (manufactured by Shinano Electric Refining Co., Ltd.) may be used.

<Manufacturing Method of Light-Emitting Device>

First, the supporting substrate 2 is prepared and on the supporting substrate 2 the organic EL element 3 is produced. A forming method of the organic EL element is described below.

Next, the heat conducting member 4 is supplied on at least any one of the organic EL element 3 and the sealing substrate 5. At this process, when a material that can be cured by applying energy such as a photo-curable resin and a thermo-curable resin is used as the heat conducting member 4, the photo-curable resin or the thermo-curable resin is supplied as the heat conducting member 4 on at least any one of the organic EL element 3 and the sealing substrate 5.

The heat conducting member 4 may be supplied on the organic EL element 3 or on the convex portion 6 of the sealing substrate 5, or may be supplied on both the organic EL element 3 and the convex portion 6 of the sealing substrate 5. The heat conducting member 4 may be supplied by using a general applying apparatus for sealing agent, for example, by using a dispenser.

When the heat conducting member 4 is supplied, if necessary, also a sealing member may be supplied, for example, to a periphery of the supporting substrate 2 or the sealing substrate 5.

Next, the supporting substrate 2 and the sealing substrate 5 are contacted with pressure so that the convex portion 6 of the sealing substrate 5 is overlapped with the organic EL element 3. In the embodiment illustrated in FIG. 1, alignment is performed such that the convex portion 6 of the sealing substrate 5 is overlapped with the organic EL element 3, and then the supporting substrate 2 and the sealing substrate 5 are contacted with pressure. When a material that can be cured by applying energy is used as the heat conducting member 4, after the supporting substrate 2 and the sealing substrate 5 are contacted with pressure, the heat conducting member 4 is cured by irradiating with light or applying heat.

As described above, because an area of an overlapped region of the convex portion 6 and the organic EL element 3 is smaller than an area of the organic EL element 3 as viewed from a thickness direction of the supporting substrate 2, when the sealing substrate 5 and the supporting substrate 2 are contacted with a predetermined pressure, the stress per unit area applied to the surface of the convex portion 6 becomes higher. Therefore, compared to the case that an area of an overlapped region of the convex portion 6 and the organic EL element 3 is the same as an area of the organic EL element 3, when the sealing substrate 5 and the supporting substrate 2 are contacted with pressure, the stress per unit area applied to the surface of the convex portion 6 becomes higher and thereby a film thickness of the heat conducting member 4 interposed between the overlapping surfaces of the convex portion 6 and the organic EL element 3 can be made thin. Thus, by reducing a film thickness of the heat conducting member 4, heat conduction from the organic EL element 3 to the sealing substrate 5 can be improved well and as the result a light-emitting device 1 having high heat dissipation can be obtained.

It is preferable that an area of an overlapped region of the convex portion 6 and the organic EL element 3 becomes smaller in view of obtaining a thin-film heat conducting member 4. This is because, when an area of the overlapped region is smaller, the stress per unit area applied to the surface of the convex portion 6 becomes higher in contacting the sealing substrate 5 and the supporting substrate 2 with pressure. On the other hand, it is preferable that an area of an overlapped region of the convex portion 6 and the organic EL element 3 is larger in view of heat dissipation. By considering these viewpoints or further taking into consideration a material for the heat conducting member 4, an area of an overlapped region of the convex portion 6 and the organic EL element 3 is, for example 30% to 95%, preferably 50% to 90% of an area of the organic EL element 3.

The above manufacturing method of the light-emitting device may also be employed for manufacturing the light-emitting devices of the embodiments illustrated in FIG. 2 to FIG. 6 as described below.

Figure 2:
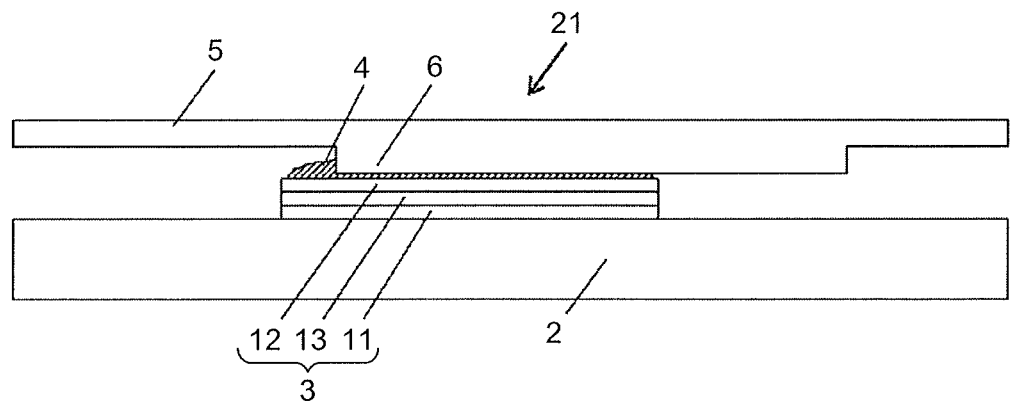
FIG. 2 is a schematic view from the side, illustrating a light-emitting device 21 according to another embodiment of the present invention.

FIG. 2 is a schematic view illustrating a light-emitting device 21 of another embodiment of the present invention. The light-emitting device 21 of the embodiment illustrated in FIG. 2 is different from the light-emitting device 1 of the embodiment illustrated in FIG. 1 only in the shape of a convex portion 6. Therefore, the parts corresponding to the same are indicated with the same symbols, and duplicated explanations will be omitted, in some cases.

A sealing substrate 5 of the embodiment illustrated in FIG. 2 has a convex portion 6 having an area larger than that of an organic EL element 3 as viewed from a thickness direction of a supporting substrate 2. In the embodiment illustrated in FIG. 2, as viewed from a thickness direction of the supporting substrate 2, a center position of the convex portion 6 is displaced from a center position of the organic EL element 3 to attach the sealing substrate 5; thus, a part of the mentioned convex portion is disposed so as to overlap the organic EL element 3, and therefore the area of the overlapped region of the convex portion 6 and the organic EL element 3 is smaller than the area of the organic EL element 3. In this way, as viewed from a thickness direction of the sealing substrate 5, because the area of the overlapped region of the convex portion 6 and the organic EL element 3 is smaller than an area of the organic EL element 3, as described in the former embodiment, a heat conducting member 4 having a thin film thickness can be obtained, and as the result, a light-emitting device 21 having high heat dissipation can be achieved.

Figure 3:
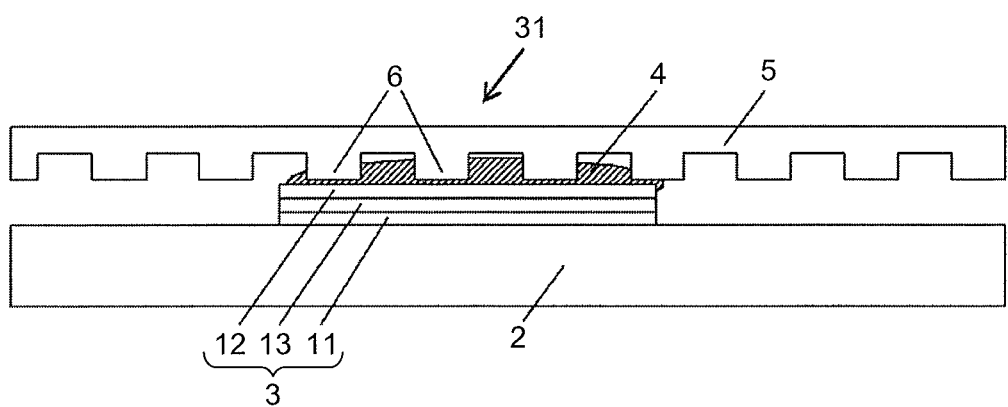
FIG. 3 is a schematic view from the side, illustrating a light-emitting device 31 according to still another embodiment of the present invention.

FIG. 3 is a schematic view illustrating a light-emitting device 31 of still another embodiment of the present invention. The light-emitting device 31 of the embodiment illustrated in FIG. 3 is different from the light-emitting device of the embodiment illustrated in FIG. 1 only in the shape of a convex portion 6. Therefore, the parts corresponding to the same are indicated with the same symbols and duplicated explanations will be omitted, in some cases.

A sealing substrate 5 of the embodiment illustrated in FIG. 3 has more convex portions 6 compared to the number of organic EL elements 3. A plurality of convex portions 6 may be formed only in a region in which the organic EL elements 3 is overlapped under a state that the sealing substrate 5 and the supporting substrate 2 are attached as viewed from a thickness direction of the supporting substrate 2. Or a plurality of convex portions 6 may be provided all over in a predetermined region of the sealing substrate 5, for example in a region that may possibly be overlapped with the organic EL elements 3. The number of convex portions 6 per unit area in the sealing substrate 5 is larger than the number of organic EL elements 3 per unit area. In the embodiment illustrated in FIG. 3, as viewed from a thickness direction of the supporting substrate 2, a plurality of convex portions 6 are disposed to be overlapped with one organic EL element 3, and the area of the overlapped region of the convex portions 6 and the organic EL element 3 is smaller than the area of the organic EL element 3. Thus, because the area of the overlapped region of the convex portions 6 and the organic EL element 3 is smaller than the area of the organic EL element 3 as viewed from a thickness direction of the sealing substrate 5, as described in the above-mentioned embodiment, a sealing member having a thin film thickness can be obtained, and as the result, a light-emitting device 31 having high heat dissipation can be achieved.

When using a sealing substrate having the same number of convex portions as the organic EL elements, it is necessary that, alignment for the positions of both is performed so as to overlapping the convex portions with the organic EL elements, and then the sealing substrate and the supporting substrate are attached. However, as illustrated in the embodiment of FIG. 3, when using a sealing substrate 5 having more convex portions 6 compared to the number of the organic EL elements 3, it is not necessary to perform alignment precisely for the positions between the sealing substrate 5 and the supporting substrate 2, and the sealing substrate 5 and the supporting substrate 2 can be attached so that the organic EL elements 3 are overlapped with the convex portions 6 and thereby attaching can be easily performed.

Figure 4:
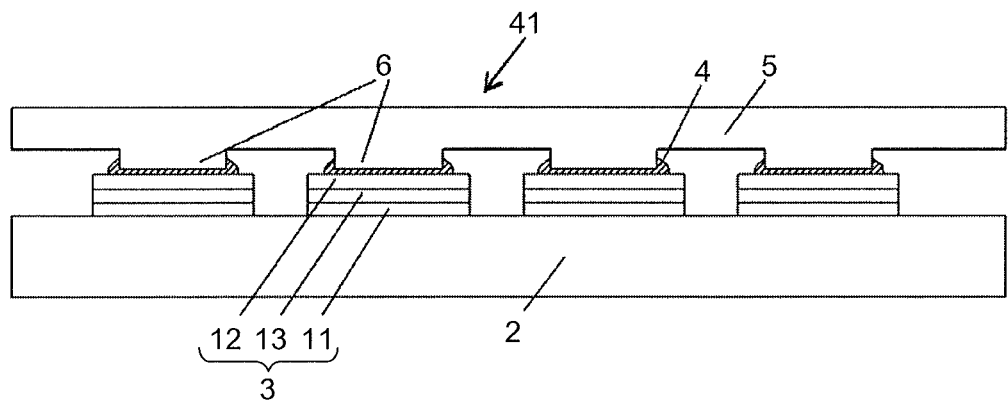
FIG. 4 is a schematic view from the side, illustrating a light-emitting device 41 according to still another embodiment of the present invention.

FIG. 4 is a schematic view illustrating a light-emitting device 41 of still another embodiment of the present invention. The light-emitting device 41 of the embodiment illustrated in FIG. 4 is different from the light-emitting device 1 of the embodiment illustrated in FIG. 1 only in that a plurality of organic EL elements 6 are provided on the supporting substrate 2 and a plurality of convex portions 6 are provided corresponding to the number of these organic EL elements 3, the parts corresponding to the same are indicated with the same symbols and duplicated explanations will be omitted, in some cases.

In the light-emitting device 41 of the embodiment illustrated in FIG. 4, a plurality of organic EL elements 3 are provided on a supporting substrate 2. A plurality of organic EL elements 3 may have a series-connected composition or a parallel-connected composition, further may have a composition combining a series connection and a parallel connection.

A sealing substrate 5 of the embodiment illustrated in FIG. 4 has the same number of convex portions 6 as organic EL elements 3. Relation between each of the convex portion 6 and the organic EL element 3 is the same as that of the embodiment illustrated in FIG. 1 or FIG. 2. That is, each convex portion 6 is attached with each organic EL element 3 through a heat conducting member 4. Each convex portion 6 is configured so that the convex portion 6 is overlapped with the organic EL element 3 one by one. As viewed from a thickness direction of the supporting substrate 2, an area of one convex portion 6 facing the organic EL element 3 is smaller than an area of the surface of one organic EL element 3 in a thickness direction of the supporting substrate 2. Therefore, the area of the overlapped region of each convex portion 6 and each organic EL element 3 is smaller than the area of each organic EL element 3. Thus, because the area of an overlapped region of each convex portion 6 and each organic EL element 3 is smaller than the area of each organic EL element 3 as viewed from a thickness direction of the sealing substrate 5, as described in the above-mentioned embodiment, a sealing member having a thin film thickness can be obtained, and as the result, a light-emitting device 41 having high heat dissipation can be achieved.

Figure 5:
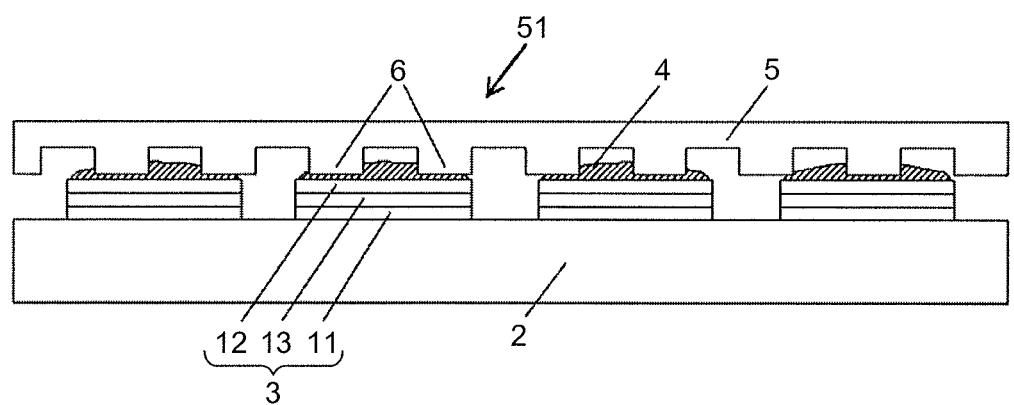
FIG. 5 is a schematic view from the side, illustrating a light-emitting device 51 according to still another embodiment of the present invention.

FIG. 5 is a schematic view illustrating a light-emitting device 51 of still another embodiment of the present invention. The light-emitting device 51 of the embodiment illustrated in FIG. 5 is different from the light-emitting device 41 of the embodiment illustrated in FIG. 4 only in the shape of a convex portion 6 of a sealing substrate 5. Therefore, the parts corresponding to the same are indicated with the same symbols and duplicated explanations will be omitted in some cases.

The sealing substrate 5 of the embodiment illustrated in FIG. 5 has more convex portions 6 compared to the number of organic EL elements 3. A plurality of convex portions 6 may be overlapped with one organic EL element 3. With regard to one convex portion 6, a part of one surface thereof facing the organic EL element 3 may be overlapped with one organic EL element 3, or the whole surface of one convex portion 6 facing the organic EL element 3 may be overlapped with one organic EL element 3. A plurality of these convex portions 6 may be formed only in a region in which the organic EL elements 3 is overlapped under a state that the sealing substrate 5 and the supporting substrate are attached as viewed from a thickness direction of the supporting substrate 2; or a plurality of convex portions 6 may be provided all over in a predetermined region of a sealing substrate 5, for example in a region that may possibly be overlapped with the organic EL elements 3, irrespective of the exact position of each organic EL element 3. The number of convex portions 6 per unit area in the sealing substrate 5 is larger than the number of organic EL elements 3 per unit area. Even when a plurality of convex portions 6 are configured to be overlapped with one organic EL element 3 as viewed from a thickness direction of the supporting substrate 2, an area of an overlapped region of these convex portions 6 and the organic EL element 3 is smaller than an area of the organic EL element 3. Thus, because the area of an overlapped region of the convex portions 6 and the organic EL elements 3 is smaller than the area of the organic EL element 3 as viewed from a thickness direction of the sealing substrate 5, as described in the above-mentioned embodiment, a sealing member 4 having a thin film thickness can be obtained, and as the result, a light-emitting device 51 having high heat dissipation can be achieved.

When using a sealing substrate having the same number of convex portions as organic EL elements, it is necessary that, alignment for the positions of both is performed such that the convex portion and the EL element are overlapped, and then the sealing substrate and the supporting substrate are attached. However, as illustrated in the embodiment of FIG. 5, when using the sealing substrate 5 having more convex portions 6 compared to the number of organic EL elements 3, it is not necessary to perform alignment precisely for the positions between the sealing substrate 5 and the supporting substrate 2, and the sealing substrate 5 and the supporting substrate 2 can be easily attached so that the organic EL elements 3 and the convex portions 6 are overlapped and thereby attaching can be easily performed.

Figure 6:
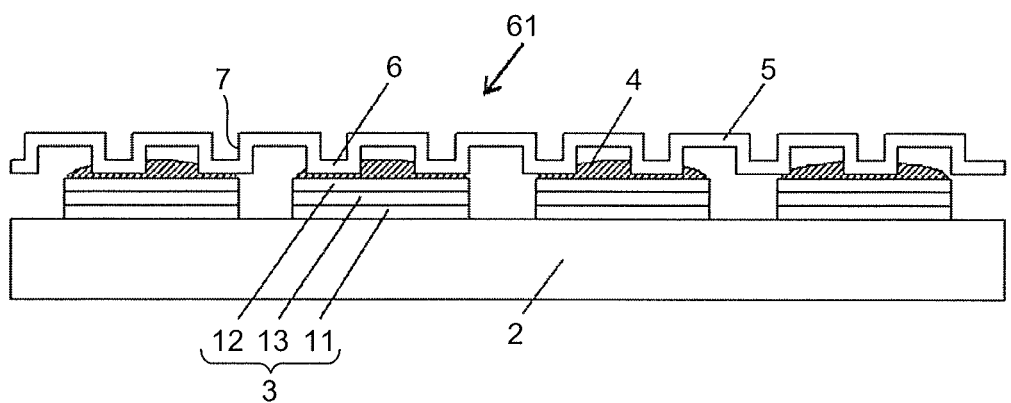
FIG. 6 is a schematic view from the side, illustrating a light-emitting device 61 according to still another embodiment of the present invention.

FIG. 6 is a schematic view illustrating a light-emitting device 61 of still another embodiment of the present invention. The light-emitting device 61 of the embodiment illustrated in FIG. 6 is different from the light-emitting device of the embodiment illustrated in FIG. 5 only in a sealing substrate 5. Therefore, the parts corresponding to the same are indicated with the same symbols and duplicated explanations will be omitted, in some cases.

In the embodiment illustrated in FIG. 6, a light-emitting device in which a plurality of organic EL elements are provided is described, and the sealing substrate 5 of the embodiment illustrated in FIG. 6 may be applied also to the light-emitting devices of the above-mentioned embodiments illustrated in FIGS. 1 to 5 in the same manner.

The sealing substrate 5 has concave areas (a concave portion 7) that are formed on a side opposite to the side facing a supporting substrate 2 and configured to be along a shape of the convex portion 6. For example, when the convex portion 6 is configured to be a matrix pattern, the concave portion 7 is formed at a position corresponding to the position of the convex portion 6. That is, the concave portion 7 is configured to be a matrix pattern. When the convex portion 6 is formed into a plurality of strips shaped pattern, a lattice pattern or an oblique lattice pattern, along with a shape of the pattern of the convex portion 6, the concave portion 7 is formed into a plurality of strips shaped pattern, a lattice pattern or an oblique lattice pattern.

In this way, a concave portion, the shape of which is along a shape of the convex portions 6, is formed on a surface of the sealing substrate wherein the surface of the sealing substrate is at a side opposite to the side facing the supporting substrate 2; thereby, a contact area of the sealing substrate 5 with the air becomes large, and heat conducted to the sealing substrate 5 can be efficiently dissipated into the air. As the result, a light-emitting device 61 having high heat dissipation can be produced.

<Organic EL Element>

Hereinafter, the organic EL element is described further in detail.

Organic EL elements are broadly categorized into: a low molecular weight type element in which a low molecular compound is used as the material for a predetermined layer provided between a pair of electrodes; and a macromolecular weight type element in which a macromolecular compound is used as the material for a predetermined layer provided between a pair of electrodes. The present invention may be preferably applied to both types of organic EL elements.

The embodiments in FIG. 1 to FIG. 6 illustrate examples in which the organic EL element 3 includes two electrodes 12 and 11 and the light emitting layer 13 interposed between these electrodes, and as described in detail below, the organic EL element can employ various types of layered structures.

The organic EL element has an anode and a cathode which are included in a pair of electrodes and a light emitting layer provided between the electrodes, as an essential composition element. The organic EL element may have, between a pair of electrodes, not only a light emitting layer, but also another layer different from the light-emitting layer, or may have a plurality of light-emitting layers.

As a layer(s) provided between the cathode and the light-emitting layer, for example, an electron injection layer, an electron transport layer, and a hole block layer are included. When both the electron injection layer and the electron transport layer are provided between the cathode and the light-emitting layer, a layer in contact with the cathode is called the electron injection layer and a layer other than this electron injection layer is called the electron transport layer.

The electron injection layer has a function of improving electron injection efficiency from a cathode. The electron transport layer has a function of improving electron injection from a layer in contact with the surface of the cathode side. The hole block layer has a function of blocking hole transport. When the electron injection layer or the electron transport layer or both have the function of blocking hole transport, these layers may double also serving as a hole block layer.

With regarding to whether the hole block layer has the function of blocking hole transport, for example, it is possible to confirm by preparing an element allowing only a flow of hole currents and observing a decrease in its current value.

As a layer(s) provided between the anode and the light-emitting layer, for example, a hole injection layer, a hole transport layer, and an electron block layer are included. When both the hole injection layer and the hole transport layer are provided between the anode and the light-emitting layer, a layer in contact with the anode is called the hole injection layer and a layer other than the hole injection layer is called the hole transport layer.

The hole injection layer has a function of improving hole injection efficiency from an anode. The hole transport layer has a function of improving hole injection from a layer in contact with the surface of the anode side. The electron block layer has a function of blocking electron transport. When the hole injection layer and/or the hole transport layer have (has) the function of blocking electron transport, these layers may double also serving as an electron block layer.

With regarding to whether the electron block layer has the function of blocking electron transport, for example, it is possible to confirm by preparing an element allowing only a flow of electron currents and observing a decrease in its current value.

The electron injection layer and the hole injection layer may be called collectively as a charge injection layer, and the electron transport layer and the hole transport layer together may be called collectively as a charge transport layer.

Examples of a layered structure of an organic EL element of the present embodiment are listed below.
a) anode/light-emitting layer/cathode;
b) anode/hole injection layer/light-emitting layer/cathode;
c) anode/hole injection layer/light-emitting layer/electron injection layer/cathode;
d) anode/hole injection layer/light-emitting layer/electron transport layer/cathode;

e) anode/hole injection layer/light-emitting layer/electron transport layer/electron injection layer/cathode;
f) anode/hole transport layer/light-emitting layer/cathode;
g) anode/hole transport layer/light-emitting layer/electron injection layer/cathode;
h) anode/hole transport layer/light-emitting layer/electron transport layer/cathode;
i) anode/hole transport layer/light-emitting layer/electron transport layer/electron injection layer/cathode;
j) anode/hole injection layer/hole transport layer/light-emitting layer/cathode;
k) anode/hole injection layer/hole transport layer/light-emitting layer/electron injection layer/cathode;
l) anode/hole injection layer/hole transport layer/light-emitting layer/electron transport layer/cathode;
m) anode/hole injection layer/hole transport layer/light-emitting layer/electron transport layer/electron injection layer/cathode;
n) anode/light-emitting layer/electron injection layer/cathode;
o) anode/light-emitting layer/electron transport layer/cathode; and
p) anode/light-emitting layer/electron transport layer/electron injection layer/cathode.

(The symbol "/" indicates that the layers at the both sides of the symbol "/" are stacked adjacent to each other. The same applies to the description below.)

An organic EL element of the present embodiment may have two or more light-emitting layers. With regard to one of the above layered structures a) to p), when a layered structure body sandwiched between the anode and the cathode is assumed to be "structure unit A", as the component of an organic EL element having two light-emitting layers, a layer component is indicated in the following q). The two layered components of (structure unit A) may be the same, or different from each other.

q) anode/(structure unit A)/charge generating layer/(structure unit A)/cathode

When "(structure unit A)/charge generating layer" is assumed to be "structural unit B", as the component of an organic EL element having three or more light-emitting layers, a layer component is indicated in the following r). r) anode/(structure unit B)x/(structure unit A)/cathode The symbol "x" represents an integer of 2 or more and (structure unit B)x represents a layered structure body obtained by stacking the structure unit B as many as the number "x". The layered component of a plurality of (structure units B) may be the same, or different from each other.

Here, a charge generating layer is a layer which generates a hole and an electron by applying an electric field to the layer. As the Example of an charge generating layer, for example, thin films composed of a material such as vanadium oxide, indium tin oxide (abbreviation: ITO), and molybdenum oxide are included.

In an organic EL element, the anode in a pair of electrodes comprising an anode and a cathode may be provided at a position nearer to a supporting substrate than that of the cathode, or the cathode may be provided at a position nearer to a supporting substrate than that of the anode. For example, the organic EL element may be an organic EL element in which each layer of a layered structure selected from the above a) to r) is disposed in order from the right end on a supporting substrate, or an organic EL element in which each layer of a layered structure selected from the above a) to r) is disposed in order from the left end.

In an organic EL element of the present embodiment, for improving adhesion with an electrode or improving charge injecting property from an electrode, an insulation layer having a film thickness of 2 nm or less may be further provided at a position adjacent to the electrode. For improving adhesion or preventing mixing at an interface of a layer, a thin buffer layer may be provided between layers of the above-described layered structures.

The order of stacking layers, the number of layers, and the thickness of each layer may be set as appropriate, taking into consideration light-emitting efficiency and element lifetime.

Next, materials for an organic EL element and a forming method of each layer constituting an organic EL element are described, more specifically.

<Anode>

In the case of an organic EL element having a structure in which light emitted from a light-emitting layer is emitted through an anode, an electrode having optical transparency is used for the anode. As the electrode having optical transparency, a thin film of a metal oxide, a metal sulfide or a metal may be used, and a material having high electric conductivity and high light transmittance is preferably used. Specifically, a thin film composed of indium oxide, zinc oxide, tin oxide, indium tin oxide (ITO), indium zinc oxide (IZO), gold, platinum, silver or copper may be used, and among them a thin film composed of ITO, IZO, or tin oxide is preferably used. As a production method of an anode, for example a vacuum evaporation method, a sputtering method, an ion plating method, and a plating method are included. As the anode, an organic transparent conductive film made from a polyaniline or a derivative thereof, a polythiophene or a derivative thereof or the like may be used.

A film thickness of an anode may be selected as appropriate, taking into consideration required characteristics and easiness of film forming, and for example is 10 nm to 10 μm, preferably 20 nm to 1 μm, and more preferably 50 nm to 500 nm.

<Hole Injection Layer>

As a hole injection material composing a hole injection layer, the following are included: oxides such as vanadium oxide, molybdenum oxide, ruthenium oxide, and aluminum oxide; phenylamines; star burst-type amines; phthalocyanines; amorphous carbon; polyaniline; and polythiophene derivatives.

As a film-forming method of the hole injection layer, film forming from a solution containing a hole injection material may be included. For example, a hole injection layer may be formed by applying a solution containing a hole injection material by a particular applying method to form a film, and solidifying the resultant film.

As a solvent for the solution including a hole injection material, it is not particularly limited so long as the solvent can dissolve a hole injection material. Examples of the solvent for the solution including a hole injection material may include: chlorinated solvents such as chloroform, methylene chloride, and dichloroethane; ether solvents such as tetrahydrofuran; aromatic hydrocarbon solvents such as toluene and xylene; ketone solvents such as acetone and methyl ethyl ketone; ester solvents such as ethyl acetate, butyl acetate, and ethylcellosolve acetate; and water.

Examples of an applying method may include a spin coating method, a casting method, a micro gravure coating method, a gravure coating method, a bar coating method, a roll coating method, a wire bar coating method, a dip coating method, a spray coating method, a screen printing method, a flexo printing method, an off-set printing method, and an inkjet printing method.

A film thickness of a hole injection layer is set as appropriate, taking into consideration required characteristics and easiness of film forming, for example is 1 nm to 1 μm, preferably 2 nm to 500 nm, and more preferably 5 nm to 200 nm.

<Hole Transport Layer>

Examples of hole transport material composing a hole transport layer may include: a polyvinyl carbazole or derivatives thereof, a polysilane or derivatives thereof, polysiloxane derivatives having an aromatic amine at a side chain or a main chain, pyrazoline derivatives, arylamine derivatives, stilbene derivatives, triphenyldiamine derivatives, a polyaniline or derivatives thereof, a polythiophene or derivatives thereof, a polyarylamine or derivatives thereof, a polypyrrole or derivatives thereof, poly(p-phenylenevinylene) or derivatives thereof, and poly(2,5-thienylenevinylene) or derivatives thereof.

Among these hole transport materials, preferred materials are macromolecular hole transport materials such as a polyvinyl carbazole or derivatives thereof, a polysilane or derivatives thereof, polysiloxane derivatives having an aromatic amine compound group at a side chain or a main chain, a polyaniline or derivatives thereof, a polythiophene or derivatives thereof, a polyarylamine or derivatives thereof, a poly (p-phenylenevinylene) or derivatives thereof, and poly(2,5-thienylenevinylene) or derivatives thereof, and more preferred materials are a polyvinyl carbazole or derivatives thereof, a polysilane or derivatives thereof, and polysiloxane derivatives having an aromatic amine at a side chain or a main chain. When using a low molecular hole transport material, it is preferable that the material is dispersed in a macromolecular binder to be used.

As for a film-forming method of a hole transport layer, it is not particularly limited: when using a low molecular hole transport material, for example, a film-forming from a mixture containing a macromolecular binder and a hole transport material may be included; and when using a macromolecular hole transport material, for example, a film-forming from a solution containing a hole transport material may be included.

As the solvent used for the film forming from a solution, it is not particularly limited so long as the solvent can dissolve a hole transport material. Examples of the solvent used for the film forming from a solution may include: chlorinated solvents such as chloroform, methylene chloride, and dichloroethane; ether solvents such as tetrahydrofuran; aromatic hydrocarbon solvents such as toluene and xylene; a ketone solvent solvents such as acetone and methyl ethyl ketone; and ester solvents such as ethyl acetate, butyl acetate, and ethylcellosolve acetate.

As for the film-forming method from a solution, the same applying methods as the above film-forming method of a hole injection layer may be employed.

As a macromolecular binder to be mixed, a binder that does not extremely inhibit electric charge transport is preferable, and a binder in which absorbing visible light is weak is preferably used. Examples of the macromolecular binder may include a polycarbonate, a polyacrylate, a polymethyl acrylate, a polymethyl methacrylate, a polystyrene, a polyvinyl chloride and a polysiloxane.

A film thickness of a hole transport layer is set as appropriate, taking into consideration required characteristics and easiness of film forming is, for example, 1 nm to 1 μm, preferably 2 nm to 500 nm, and more preferably 5 nm to 200 nm.

<Light-Emitting Layer>

A light-emitting layer is usually formed mainly from an organic substance emitting fluorescence and/or phosphorescence, or from such the organic substance and a dopant assisting the organic substance. The dopant is blended, for example for improving light-emitting efficiency or changing light-emitting wavelength. The organic substance may be a low molecular compound or a macromolecular compound. A solubility of macromolecular compounds to a solvent is higher than that of low molecular compounds in general, and therefore a macromolecular compound is suitably used for an applying method. For this reason, when forming a light-emitting layer by an applying method, it is preferable that the light-emitting layer contains a macromolecular compound. The number average molecular weight based on polystyrene of the macromolecular compound composing a light-emitting layer is for example about $10^3$ to $10^8$. Examples of light-emitting material composing a light-emitting layer may include dye material, metal complex material, macromolecular material, and dopant material, as described below.

(Dye Materials)

Examples of the dye material may include cyclopentamine derivatives, tetraphenylbutadiene derivative compounds, triphenylamine derivatives, oxadiazole derivatives, pyrazoloquinoline derivatives, distyrylbenzene derivatives, distyrylarylene derivatives, pyrrole derivatives, thiophene ring compounds, pyridine ring compounds, perinone derivatives, perylene derivatives, oligothiophene derivatives, oxadiazole dimers, pyrazoline dimers, quinacridone derivatives, and coumarin derivatives.

(Metal Complex Materials)

Examples of the metal complex material may include metal complexes having a rare metal such as Tb, Eu or Dy or Al, Zn, Be, Ir, Pt or the like as a central metal and having an oxadiazole, thiadiazole, phenylpyridine, phenylbenzimidazole, quinoline structure or the like as a ligand, and specifically may include: metal complexes emitting light from a triplet excited state such as an iridium complex and a platinum complex; aluminum-quinolinole complexes; benzoquinolinol-beryllium complexes; benzoxazolyl-zinc complexes; benzothiazole-zinc complexes; azomethyl-zinc complexes; porphyrin-zinc complexes; and phenanthroline-europium complexes.

(Macromolecular Materials)

Examples of the macromolecular material may include: a poly-p-phenylenevinylene derivative, a polythiophene derivative, a poly-p-phenylene derivative, a polysilane derivative, a polyacetylene derivative, a polyfluorene derivative, a polyvinylcarbazole derivative, the above dye material and materials prepared by polymerizing the above metal complex light-emitting material.

Among the above light-emitting materials, examples of material emitting blue light may include distyrylarylene derivatives and polymers thereof, oxadiazole derivatives and polymers thereof, polyvinylcarbazole derivatives, poly-p-phenylene derivatives, and polyfluorene derivatives. Among them, preferred materials are macromolecular materials such as polyvinylcarbazole derivatives, poly-p-phenylene derivatives and polyfluorene derivatives.

Examples of material emitting green light may include quinacridone derivatives and polymers thereof, coumarin derivatives and polymers thereof, poly-p-phenylenevinylene derivatives, and polyfluorene derivatives. Among them, preferred materials are macromolecular materials such as poly-p-phenylenevinylene derivatives and polyfluorene derivatives.

Examples of material emitting red light may include coumarin derivatives and polymers thereof, thiophene ring compounds and polymers thereof, poly-p-phenylenevinylene derivatives, polythiophene derivatives, and polyfluorene derivatives. Among them, preferred materials are macromolecular materials such as poly-p-phenylenevinylene derivatives polythiophene derivatives, and polyfluorene derivatives.

(Dopant Materials)

Examples of dopant material may include perylene derivatives, coumarin derivatives, rubrene derivatives, quinacridone derivatives, squarylium derivatives, porphyrin derivatives, styryl dyes, tetracene derivatives, pyrazolone derivatives, a decacyclene, and a phenoxazone. A thickness of the light-emitting layer is usually 2 nm to 200 nm.

Examples of a film-forming method of a light-emitting layer may include a method for film forming from a solution, a vacuum evaporation method, and a transfer method. Examples of a solvent used for the method for film forming from a solution may include the same solvents as the solvent used for the above film forming of a hole injection layer from a solution.

Examples of a method for applying the solution for the film forming from a solution may include: coating methods such as a spin coating method, a casting method, a micro gravure coating method, a gravure coating method, a bar coating method, a roll coating method, a wire bar coating method, a dip coating method, a slit coating method, a capillary coating method, a spray coating method, and a nozzle coating method; and applying methods such as a gravure printing method, a screen printing method, a flexo printing method, an off-set printing method, a reverse printing method, and an inkjet printing method. In view of easiness for patterning or coating in various different colors, preferred methods are: printing methods such as a gravure printing method, a screen printing method, a flexo printing method, an off-set printing method, a reverse printing method, and an inkjet printing method. When using a low molecular compound having sublimability, the vacuum evaporation method may be used. Further, a method for forming a light-emitting layer only at a desired position by transfer or thermal transfer by laser may be used.

<Electron Transport Layer>

As the electron transport material constituting an electron transport layer, a publicly-known electron transport material may be used. Examples of the electron transport material may include: oxadiazole derivatives, anthraquinodimethane or derivatives thereof, benzoquinone or derivatives thereof, naphthoquinone or derivatives thereof, anthraquinone or derivatives thereof, tetracyanoanthraquinodimethane or derivatives thereof, fluorenone derivatives, diphenyldicyanoethylene or derivatives thereof, diphenoquinone derivatives, a metal complex of 8-hydroxyquinoline or derivatives thereof, polyquinoline or derivatives thereof, polyquinoxaline or derivatives thereof, and polyfluorene or derivatives thereof.

Among them, as the electron transport material, preferred materials are oxadiazole derivatives, a benzoquinone or derivatives thereof, anthraquinone or derivatives thereof, a metal complex of 8-hydroxyquinoline or derivatives thereof, polyquinoline or derivatives thereof, polyquinoxaline or derivatives thereof, and polyfluorene or derivatives thereof, and more preferred materials are 2-(4-biphenylyl)-5-(4-tert-butylphenyl)-1,3,4-oxadiazole, benzoquinone, anthraquinone, tris(8-quinolinol) aluminum, and polyquinoline.

As for a film forming method of the electron transport layer, it is not particularly limited: as for a low molecular electron transport material, a vacuum evaporation method from powder, and film forming methods from a solution or a molten state may be included; and as for a macromolecular electron transport material, film forming methods from a solution or a molten state may be included. When using the film forming methods from a solution or a molten state, a macromolecular binder may be used in combination. As the film forming method of an electron transport layer from a solution, the same methods as the above-described film-forming method of a hole injection layer may be employed.

A film thickness of the electron transport layer is set as appropriate, taking into consideration required characteristics and easiness of film forming, for example is 1 nm to 1 μm, preferably 2 nm to 500 nm, and further preferably 5 nm to 200 nm.

<Electron Injection Layer>

A material composing an electron injection layer may be appropriately selected according to the type of the light-emitting layer. Examples of material composing an electron injection layer may include: an alkali metal; an alkaline earth metal; an alloy containing one or more type(s) of an alkali metal and an alkaline earth metal: an oxide, a halide, or a carbonate of an alkali metal or an alkaline earth metal; and a mixture of these substances. Examples of the alkali metal, and the oxide, the halide and the carbonate of the alkali metal may include lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, and lithium carbonate. Examples of the alkaline earth metal, and the oxide, the halide and the carbonate of the alkaline earth metal may include magnesium, calcium, barium, strontium, magnesium oxide, magnesium fluoride, calcium oxide, calcium fluoride, barium oxide, barium fluoride, strontium oxide, strontium fluoride, and magnesium carbonate. The electron injection layer may be a layered body prepared by stacking two or more layers, and for example a layered body of a LiF film and a Ca film (LiF/Ca) is included. An electron injection layer may be formed by an evaporation method, a sputtering method, a printing method, or the like. A film thickness of an electron injection layer is preferably about 1 nm to 1 μm.

<Cathode>

As a material for a cathode, a material having a small work function and being capable of easily injecting electrons into a light-emitting layer and having a high electric conductivity is preferable. As for an organic EL element having a configuration retrieving light from a side of an anode, in order to reflect light emitted from the light-emitting layer on a cathode toward the anode side, a material for the cathode is preferably a material having a high visible-light reflectivity. As a material for the cathode, an alkali metal, an alkaline earth metal, a transition metal, or a metal of Group 13 in the Periodic Table may be used. Specifically, examples of the material for the cathode may include: metals such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium; alloys of two or more types of these metals; alloys of one or more type(s) of these metals with one or more type(s) of gold, silver, platinum, copper, manganese, titanium, cobalt, nickel, tungsten, and tin; and graphite or graphite intercalation compounds. Examples of the alloys may include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy. As the cathode, a transparent conductive electrode composed of a conductive metal oxide and a conductive organic substance is included. Specifically, as the example of the conductive metal oxide, indium oxide, zinc oxide, tin oxide, ITO and IZO are included; and as the example of the conductive organic substance, a polyaniline or derivatives thereof and a polythiophene or derivatives thereof are included. The cathode may be a layered body prepared by stacking two or more layers. An electron injection layer may be used as the cathode.

A film thickness of a cathode is set as appropriate, taking into consideration required characteristics and easiness of film forming, and for example is 10 nm to 10 preferably 20 nm to 1 μm, more preferably 50 nm to 500 nm.

Examples of a production method of the cathode may include a vacuum evaporation method, a sputtering method and a laminate method of thermocompression-bonding a metal thin film.

The light-emitting device of each of the above embodiments can be applied to various devices requiring a light source, for example, an illuminator or a display device. The light-emitting device of the present invention improves heat dissipation characteristic; therefore, it can be preferably applied to a device having a large calorific value, for example, a backlight of an illuminator or a display device.

EXPLANATIONS OF LETTERS OR NUMERALS 1, 21, 31, 41, 51, 61 Light-emitting device
2 Supporting substrate
3 Organic EL element
4 Heat conducting member
5 Sealing substrate
6 Convex portion
7 Concave portion
11, 12 Electrode
13 Light-emitting layer

The invention claimed is:

1. A light-emitting device comprising:
 a supporting substrate;
 an organic electroluminescent element disposed on the supporting substrate;
 a sealing substrate for sealing the organic electroluminescent element, comprising a convex portion protruding toward the organic electroluminescent element; and
 a heat conducting member that is provided between the organic electroluminescent element and the convex portion,
 wherein the organic electroluminescent element and the convex portion are each in direct contact with the heat conducting member,
 wherein a part or whole of the convex portion is overlapped with the organic electroluminescent element, and an area of an overlapped region of the convex portion and the organic electroluminescent element is smaller than an area of the organic electroluminescent element, as viewed from a thickness direction of the supporting substrate.

2. The light-emitting device according to claim 1, wherein the sealing substrate comprises a plurality of convex portions, and two or more of the convex portions are configured to be overlapped with one organic electroluminescent element, as viewed from a thickness direction of the supporting substrate.

3. The light-emitting device according to claim 1, wherein a plurality of the organic electroluminescent elements are provided on the supporting substrate.

4. The light-emitting device according to claim 1, wherein the sealing substrate comprises a concave portion that is formed on a side opposite to the side facing the supporting substrate and is configured to be along a shape of the convex portion.

5. The light-emitting device according to claim 1, wherein the sealing substrate is formed of a metal.

6. The light-emitting device according to claim 1, wherein the heat conducting member includes a filler, and the filer has the highest heat conductivity among materials included in the heat conducting member.

7. The light-emitting device according to claim 6, wherein the heat conducting member includes a filler that is formed of at least one material selected from the group consisting of aluminum oxide, aluminum nitride, beryllium oxide, and boron nitride.

8. The light-emitting device according to claim 6, wherein the heat conducting member includes a filler that is formed of at least one material selected from the group consisting of aluminum, copper, silver and any alloys thereof.

9. The light-emitting device according to claim 6, wherein the heat conducting member includes a filler that is formed of at least one material selected from the group consisting of sintered materials comprising carbon or silicon.

10. A method for manufacturing a light-emitting device according to claim 1, comprising:
 forming the organic electroluminescent element on the supporting substrate;
 supplying the heat conducting member to either the organic electroluminescent element or the sealing substrate, or both; and
 contacting with pressure the supporting substrate and the convex portion of the sealing substrate being each in direct contact with the heat conducting member, such that a part or whole of the convex portion is overlapped with the organic electroluminescent element as viewed from a thickness direction of the supporting substrate.

\* \* \* \* \*